United States Patent
Bawankule et al.

(10) Patent No.: US 7,634,712 B2
(45) Date of Patent: Dec. 15, 2009

(54) TECHNIQUES FOR GENERATING CYCLIC REDUNDANCY CHECK (CRC) VALUES

(75) Inventors: Rajesh Ekras Bawankule, Sunnyvale, CA (US); Surendra Anubolu, Fremont, CA (US); James Paul Rivers, Saratoga, CA (US); David Hsi-Chen Yen, Palo Alto, CA (US)

(73) Assignee: Cisco Technology, Inc., San Jose, CA (US)

( * ) Notice: Subject to any disclaimer, the term of this patent is extended or adjusted under 35 U.S.C. 154(b) by 542 days.

(21) Appl. No.: 11/382,694

(22) Filed: May 10, 2006

(65) Prior Publication Data

US 2007/0266301 A1    Nov. 15, 2007

(51) Int. Cl.
*H03M 13/00* (2006.01)

(52) U.S. Cl. .................. 714/781; 714/779; 714/776; 714/757; 714/758

(58) Field of Classification Search .................. 714/781, 714/757, 758, 775, 776, 779
See application file for complete search history.

(56) References Cited

U.S. PATENT DOCUMENTS

| | | | |
|---|---|---|---|
| 6,560,742 B1 * | 5/2003 | Dubey et al. | 714/757 |
| 6,681,364 B1 * | 1/2004 | Calvignac et al. | 714/776 |
| 7,266,760 B1 * | 9/2007 | Bain | 714/807 |
| 2005/0066257 A1 * | 3/2005 | Tsai et al. | 714/781 |

OTHER PUBLICATIONS

"Asic Tool Page" [online]. [archived on Dec. 15, 2002]. Retrieved from the Internet: <http://web.archive.org/web/20021215015442/www.employees.org/surendra/asic/>, 1 pg.
"CRC Tool" [online]. [observed prior to Dec. 20, 2005]. Retrieved from the Internet: <http://easics.be/webtools/crctool/nav_dtml>, 2 pgs.
Peterson, W. W., et al., "Chapter 1. The Coding Problem", *In: Error-Correcting Codes*, Second Edition, The Massachusetts Institute of Technology, (1972), 1-18.
Peterson, W. W., et al., "Chapter 4. Error-Correction Capabilities of Linear Codes", *In: Error-Correcting Codes*, Second Edition, The Massachusetts Institute of Technology, (1972), 76-116.
Peterson, W. W., et al., "Chapter 8. Cyclic Codes", *In: Error-Correcting Codes*, Second Edition, The Massachusetts of Technology, (1972), 206-268.

* cited by examiner

*Primary Examiner*—Guy J Lamarre
*Assistant Examiner*—Sam Rizk
(74) *Attorney, Agent, or Firm*—Schwegman, Lundberg & Woessner, P.A.

(57) ABSTRACT

Techniques for generating cyclic redundancy check (CRC) values are provided. Bit messages that are to be transmitted to recipients are aligned to desired byte boundaries for purposes of generating CRC values, which are to be sent with the bit messages. The CRC values are rewound or adjusted back to values associated with original lengths of the bit messages before the CRC values are transmitted or forwarded with the bit messages to recipients.

24 Claims, 5 Drawing Sheets

TECHNIQUES FOR GENERATING CYCLIC REDUNDANCY CHECK (CRC) VALUES

COPYRIGHT NOTICE/PERMISSION

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in any drawings hereto: Copyright© 2006, Cisco Systems, Inc. All Rights Reserved.

FIELD

The invention relates generally to data processing and more particularly to data verification using cyclic redundancy checks (CRC's).

BACKGROUND

Cyclic redundancy check (CRC) is a common technique for detecting data transmission errors. Transmitted messages are divided into predetermined lengths that are then divided by a fixed divisor. According to the calculation, the remainder number is appended onto and sent with the message. When the message is received, the computer recalculates the remainder and compares it to the transmitted remainder. If the numbers do not match, an error is detected.

For example, in a data networking system a message is sent in binary form from a transmitter to a receiver through a medium. Errors can get introduced, in the message, which are random in nature due to noise present in the medium. Errors may be detected if a signature is sent along with message and it is compared at the receive side with the recreated signature. A simple way to accomplish this is to add a checksum to the message bytes. For example:

| Message: | FA 12 C7 D6 |
|---|---|
| Addition: | 2A9 |
| Modulo 256 Checksum: | A9 |
| Text Message and Checksum: | FA 12 C7 D6 A9 |

There are many possible scenarios of data corruption. In one example, the data is corrupted and the checksum is intact. That is, the received message may be "FA 12 C2 D6 A9" and the receiver re-calculates the checksum as "A4" which does not match with the "A9" checksum. Thus, the data packet can be discarded.

In another example, the data is intact but the checksum is corrupt. That is, the received message with checksum is "FA 12 C7 D6 A2." When the receiver re-calculates the checksum as "A9," which does not match with the received checksum of "A2," the packet has an error and can be discarded.

In a third example, the data as well as the checksum is corrupt. In most cases this will result in the packet being discarded but once in a while corruption will be such that the recreated checksum will match the corrupted checksum. Such a situation is extremely rare and highly unlikely. Unfortunately this potentiality for error with checksum processing can not be avoided and the only solution to further reduce this possibility is to widen the checksum width.

Another problem with checksum processing, is that specific CRC circuitry within hardware or CRC engines are needed for a variety of possible byte lengths (data widths). Generally, this is not an issue when received messages have greater lengths than the receiving device's CRC generators (also called CRC calculators). So, a received message of 16 bytes (128 bit word) can be evaluated by using combinations of CRC generators having 16, 15, 14, 13, 12, 11, 10, 9, 8, 7, 6, 5, 4, 3, 2, and 1 processing widths.

It is also problematic when a device lacks a small enough CRC calculator to handle received messages of smaller data widths. For example, if device has only a 6 byte wide CRC engine and a received message is 4 bytes, then more CRC calculators and processing complexity are needed to handle such message data widths. Typically, a solution to this is to have CRC calculators with data widths as small as a single byte. Yet, this is inefficient and costly approach. Implementations with multiple CRC calculators have drawbacks associated with processing latency, integration complexity, and deployment in limited space devices.

Therefore, improved techniques for CRC processing are desirable.

DETAILED DESCRIPTION

Figure 1:
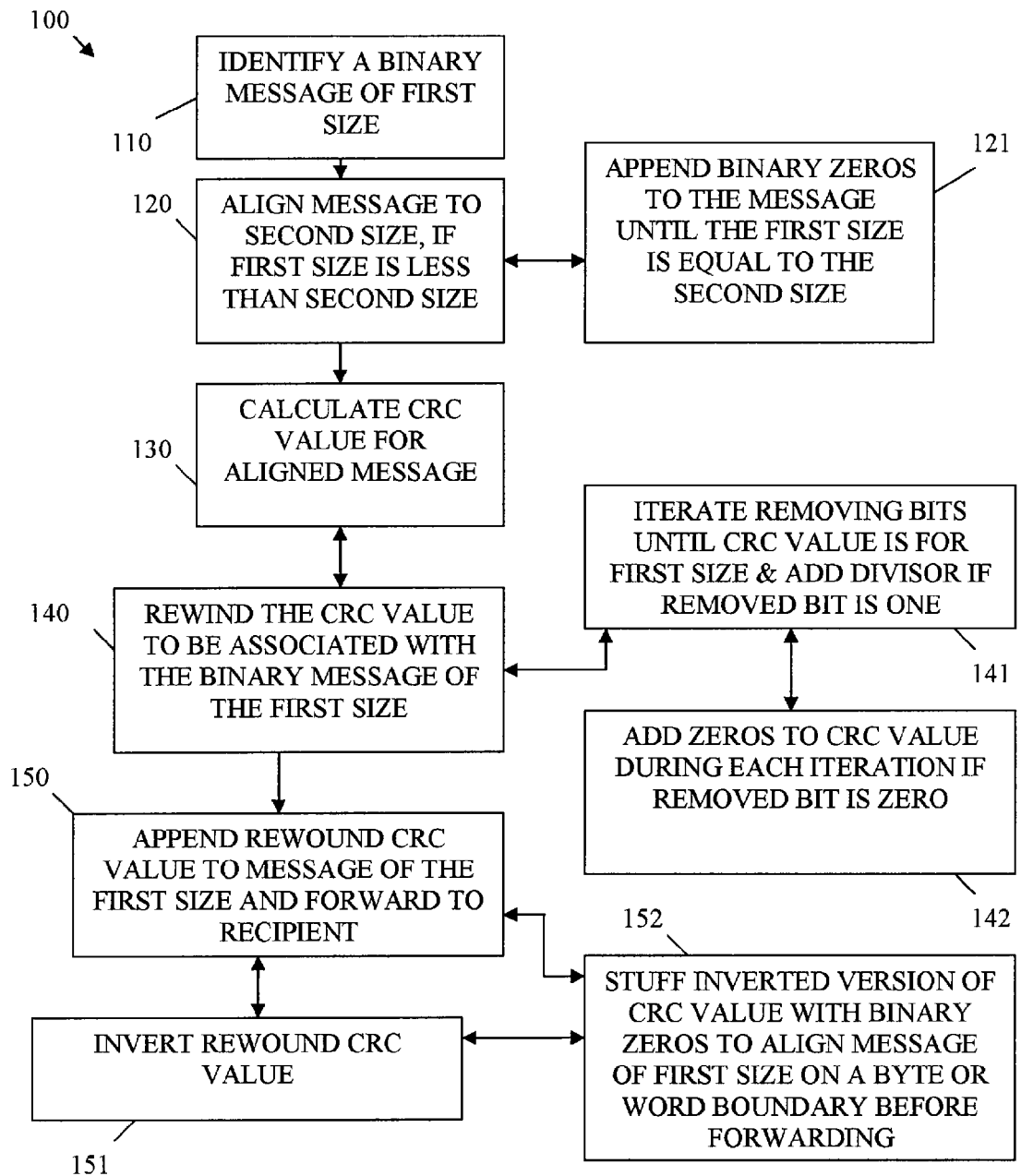
FIG. 1 is a diagram of a method for generating and checking cyclic redundancy check (CRC) values, according to an example embodiment.

FIG. 1 is a diagram of a method 100 for generating and checking cyclic redundancy check (CRC) values, according to an example embodiment. The method 100 (hereinafter "checksum service") is implemented in a machine-accessible and readable medium and is operational over a network. The network may be wired, wireless, or a combination of wired and wireless. In an embodiment, the checksum service is integrated within a network router, bridge, hub, switch, proxy, gateway, storage device, or any other processing-enabled device.

Implementing CRC in a communication system, such as an Ethernet system, where data packets are transmitted as multiples of single bytes; in wide data words such as 128 or 256 bits is difficult, complex, and often requires large circuit commitments. That is, a wide selection of concurrently available CRC calculators are typically deployed and integrated in order to effectively process CRC values (checksums) in diverse network environments.

The following example illustrates a typical algorithmic technique in binary for generating a CRC value (checksum). A binary message 1101011011 acts as dividend and a binary divisor 10011 is used to calculate a 4-bit checksum (CRC value). The binary division is:

```
                1100001010   Quotient
        10011 )11010110111110  Dividend
               10011
                010011
                10011
                 010110
                 10011
                  10100
                  10011
                    1110   = Remainder (checksum)
```

In this example, the checksum is 1110 and the transmitted message is T(x)=11010110111110. The receiver will take the received R(x) and divide it by the same divisor, 10011. If the remainder is zero then no error was detected (R(x)=T(x)) by the transmission through the medium. That is:

```
                1100001010
        10011 )11010110111110
               10011
                010011
                10011
                 010111
                 10011
                  10011
                  10011
                    00   = Checksum
```

In this example, the checksum is zero and the transmitted message did not have a detected error.

The 10011 divisor is calculated using primitive polynomials for degree 4 which is x4+x+1. Thus, 10011 is used as a 4 bit divisor. In Ethernet applications a 32-bit polynomial of: x32+x26+x23+x22+x16+x12+x11+x10+x8+x7+x5+x4+x3+x2+x1+1 is used to calculate the divisor.

As stated before separate CRC generators (calculators) are typically provided for different byte lengths (word widths) occurring over the communication channel. A multiplex circuit is then used to select the CRC values.

Embodiments described herein can generate and check CRC values (checksums) that start on an arbitrary boundary and end on an arbitrary boundary. These functions allow embodiments to be usable across various platforms and among various network protocols. Thus, the checksum service can start on an arbitrary boundary of a word. As explained above, when a communication is received a division operation is performed on both the data and CRC information (checksum) to determine if a zero checksum is produced. In Ethernet applications the CRC is calculated on data which is a multiple of a single byte, such as a 128 or 256 bit wide word.

As was demonstrated above, the CRC check performed on received data should result in a zero value when the division operation is performed on the data as well as the received CRC. Stated another way, the received checksum with the message being inspected should equal the produced checksum. In an embodiment of the present invention, checksum service for checking the frame data (binary message data received or generated) is run through a wide word CRC engine (e.g., 256 bit, 128 bit). When the CRC data is initially acquired from a source it is inverted before it is run through the wide word CRC engine (typically CRC values are inverted for transmission). Likewise, CRC data is also inverted once produced and it is readied to be sent with a message. When sending a message with a CRC value, any remaining bytes of the word may be filled with zeros to align the word with a data channel. The CRC engine calculates a CRC value for the data and this value is stored as an internal state. If the packet integrity is not lost then this internal state is the same as the inverted CRC.

With this context, the processing of the checksum service is now described with reference to FIG. 1. The checksum service can produce a CRC value (checksum) for any arbitrary binary message data word size using a single wide data path CRC calculator or engine in combination with a rewind technique that adjusts a checksum value produced from the CRC calculator so that it is associated with a CRC value for the word size, which was associated with the original binary message.

Accordingly, at 110, the checksum service identifies a binary message associated with a first size, data width, or word size (these phrases may be used interchangeably herein along with data path). The data width of the binary message may be any arbitrary size. In this case, the checksum service is being processed on a device or within the local environment of a sender of the binary message.

At 120, the checksum service aligns the binary message to a second size or data width. That is, the first size is assumed to be smaller than the second size; although, this need not always be the case, such as when the first size is equal to the second size. Recall, the checksum service utilizes a wide data path CRC calculator (e.g., 256 bit, 128 bit, etc.), by aligning the binary message to the second size the binary message is temporarily being increased in size such that it can be processed by the wide data path CRC calculator. One technique for aligning, at 121, is for appending binary zeros to the binary message until the first size becomes the second size.

Once the binary message is aligned to the wide data word having the second size, the checksum service, at 130, calculates a CRC value (checksum) for the aligned binary message. This is done by using a wide CRC calculator or engine (e.g., 256 bit, 128 bit, etc.).

However, the CRC value produced, at 130, by the CRC calculator is not associated with the true binary message of the first size; rather it is associated with the aligned and second size. Therefore, the CRC value has to be adjusted before the binary message may be sent to a recipient, such that it reflects a new or modified CRC value that represents the binary message in its original or first size.

Accordingly, at 140, the checksum service rewinds the CRC value, such that the rewound CRC value is what would have been produced by a CRC calculator that was of the same or first size. That is, the CRC value is rewound for N bits, where N is equal to the second size—the first size in order to get a proper CRC value for the binary message before it is transmitted to a recipient.

One technique for rewinding the CRC value is shown at 141, where the CRC value is iterated for N times (where N=second size−first size). During each iteration a single trailing bit is removed and analyzed from the CRC value;

although the bit length of the changing CRC value remains the same because as a trailing bit is removed and addition is performed on the result. What is occurring is the remainder of the CRC value is being multiplied forward. So, if a trailing bit of the remainder (CRC value) is set to one then the divisor (used with CRC value generation) is added back in. Additionally, at 142, if a trailing bit of the remainder is set to zero than zeros are added back in.

Consider the following scenarios to illustrate how rewinding may proceed to restore a CRC value to its proper value.

A CRC algorithm (calculator or engine), which calculates CRC on 16 bytes (128 bits) data (128 bits is the second size) can be used to calculate the CRC on first 120 bit data (first size of binary message is 120 bits) then the remaining 8 bits should be zeroed out (rewound). The 128 bit CRC can be rewound for 8 bits to get a CRC for 120 bit data. That is, the CRC engine can provide a 128 bit CRC operation and a rewind operation of the checksum service can allow for CRC calculations of less than 128 bits. Embodiments of CRC Rewind logic can be is simpler and smaller than having CRC logic for both 120 and 128 bits. It will be appreciated that the embodiments described and claimed herein are not limited to a specific bit lengths. Embodiments provide methods and systems to byte align input data using 'zero' bits such that a CRC engine can perform a common length operation on the aligned data. The CRC engine can then rewind the CRC operation to custom lengths. As a result, less CRC circuitry is needed to process variable length data.

In the following example, the message M(x) =1101011011xxxxxx is used where the x bits are residual bits used to byte align the data stream. The division shows the sequence of operations used to generate the CRC value.

```
            110000101011100
10011   )1101011011000000     Dividend
         10011
         010011
          10011
          0000010110
                10011
                0010100
                 10011
                 0011100
                  10011
                  011110
                   10011
                   011010
                    10011
                    010010
                     10011
                      0100    Extended remainder
                     00000    reverse 1 (Least Significant
                     _____           Bit (LSB) is 0)
                     00010
```

-continued

```
00000    reverse 2 (LSB is 0 add zeros)
00001
10011    reverse 3 (LSB is 1 add divisor)
 1001
10011    reverse 4 (LSB is 1)
 1101
10011    reverse 5 (LSB is 1)
01111
10011    reverse 6 (LSB is 1)
 1110      = Remainder (checksum or rewound
              CRC value)
```

This extended calculation results in 0100, but the original analysis shows that the desired remainder for the original 10 bits is 1110. It is recognized that the CRC has been calculated over too many bits (6 in this case), and the CRC needs to be reversed by multiplying the remainder forward. This is done by examining the LSB of the remainder. If it's a 1, then the divisor is added to the remainder. Once this process is complete, the correct remainder is reached.

In fact, in an embodiment a script, such as the Perl script listed below may be used to unroll the CRC rewind technique or function in an xor tree for even better synthesis results.

Balanced XOR Trees Perl Script

```
#!/usr/local/bin/perl

# perl crc unroll algo
# author : surendra
# date   : Jan 5 2004

$unroll = shift || 128;
$width = 32;
@crc_coef = (0, 1, 2, 4, 5, 7, 8, 10, 11, 12, 16, 22, 23, 26, 32 );
foreach $i (0..$width) {
    $poly[$i] = 0;
}
foreach $i (@crc_coef) {
    $poly[$i] = 1;
}
# start with lfsr equal final crc
foreach $i (0..($width-1)) {
    $lfsr[$i] = " $i ";
}
#now for unroll clocks
foreach $clk (0..$unroll-1) {
    # copy lfsr to nlsr
    for ($ci = 0; $ci < $width; $ci++) {
        $nlfsr[$ci] = $lfsr[$ci];
    }
    $fb = $lfsrf[0];
    $nlfsr[$width-1] = $fb;
    for ($bit=$width-2; $bit >= 0; $bit--) {
        $nlfsr[$bit] = ($poly[$bit+1] == 1) ? XorC($lfsr[$bit+1], $fb)
                                            : $lfsr[$bit+1];
    }
    for ($ci = 0; $ci < $width; $ci++) {
        $lfsr[$ci] = $nlfsr[$ci];
    }
}
PrintCrcEqn( );
sub PrintCrcEqn {
    print "// polynomial for rollback is @crc_coef\n";
```

-continued

```
        print "module CrcRollback${width}D${unroll}(crc,nCrc);\n";
        print "input [",$width−1, ":0] crc;\n";
        print "output [",$width−1, ":0] nCrc;\n";
        for (my $fi = $width−1; $fi>=0; $fi−−) {
            my @qf = split / +/,$lfsr[$fi];
            my $elem = @qf+0;
            print "\nassign nCrc[$fi] = ";
            for ($i=0; $i<$elem; $i++) {
                $term = sprintf("crc[%d]",$qf[$i]);
                print " ^ " if ($i>0);
                print "$term";
                print "\n            "if (($i+1)%8 == 0);
            }
            print ";\n";
        }
        print "\nendmodule\n";
    }
    sub XorC {
        my ($i1,$i2) = @_;
        my ($i);
        my (%i1,%i2);
        my @i1 = split / +/,$i1;
        my @i2 = split / +/,$i2;
        foreach $i (@i1) {
            $i1{$i} = 1 unless ($i=~/^\s+$/);
        }
        foreach $i (@i2) {
            $i2{$i} = 1 unless ($i=~/^\s+$/);
        }
        my @res;
        foreach $i ( keys %i1, keys %i2) {
            next if ($i =~ /^\s+$/);
            if ( (exists $i1{$i} && !exists $i2{$i})
                || (!exists $i1{$i} && exists $i2{$i})) {
                push @res,$i;
            }
        }
        return (join ' ',(reverse sort {$a <=> $b} @res));
    }
```

© 2006 Cisco Systems, Inc. All Rights Reserved.

According to an embodiment, at 150, once the CRC value is rewound it may be appended to the binary message of the original first size and forwarded to a recipient. This may entail, at 151, inverting the rewound CRC value and, at 152, stuffing the inverted version of the rewound CRC value with binary zeros to align the message of the on a byte or word boundary before it is forwarded over the network to the recipient.

It is now appreciated how any arbitrary length message may be aligned to a wide word length for purposes of processing a wide word path CRC calculator and producing an initial CRC value. That initial CRC value is then rewound using a rewind technique to produce a CRC value for the original length of the binary message. Thus, with the processing of the checksum service permits wide data path CRC calculations for any arbitrarily bounded messages and the proper CRC values obtained via rewinding techniques.

Figure 2:
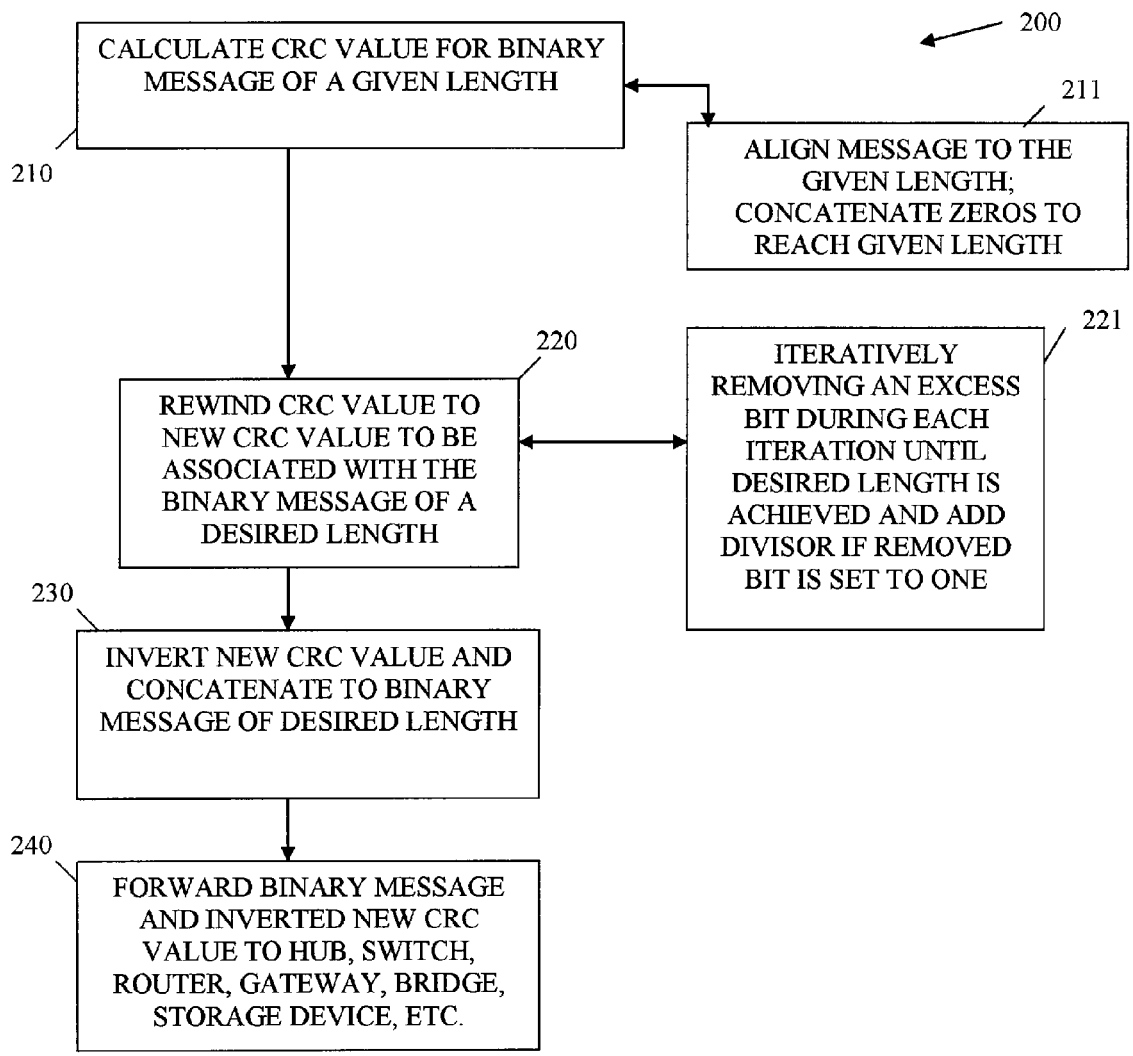
FIG. 2 is a diagram of another method for generating and checking CRC values, according to an example embodiment.

FIG. 2 is a diagram of another method 200 for generating and checking CRC values, according to an example embodiment. The method 200 is implemented as instructions within a machine-accessible and readable medium. The instructions when loaded, accessed, and processed by a machine perform the processing depicted in FIG. 2. The processing presents a different perspective to the method 100 of FIG. 1.

The instructions may be uploaded from removable medium to a machine and processed. Alternatively, the instructions maybe prefabricated within memory and/or storage of a machine. Still further, the instructions may be downloaded from the network from one machine to another machine for processing. In still another situation, the instructions may be processed on a remote machine of the network at the direction and control of another network machine.

At 210, the instructions calculate a CRC value (checksum) for a binary message of a given length or word size. According to an embodiment, at 211, the binary message is preprocessed to be aligned to the given length or given word size. This may be done by concatenating binary zeros to reach the given length from a desired length that is associated with the original and native size of the binary message.

At 220, the instructions rewind the CRC value to a new or modified CRC value that is associated with the desired or original size of the binary message. This is done by rewinding the CRC value N bits via N iterations where the remainder is multiplied forward during each iteration via addition. N is equal to the given size or aligned size minus the desired or original size.

In an embodiment, at 221, the rewinding instructions iteratively removes an excess bit or trailing bit (LSB) from the CRC value (running remainder value) during each iteration until the desired or original length is achieved. With each iteration, if the removed bit is set to one then the running remainder is added to the divisor that was used in generating the original CRC value. However, if the removed bit is set to one then the running remainder is added to a string of zeros that is equal in size to the divisor. So, the new rewound CRC value remains the same size as the original CRC value but it reflects a checksum for the binary message in its original size rather than a checksum in the given size.

In some cases, at 230, the instructions further invert the new CRC value and concatenate that inverted and rewound CRC value to the original binary message in its original or desired word size. This resulting string may also then be stuffed with trailing binary zeros to align in on a word or byte boundary.

Once the binary message and the new, inverted, and rewound CRC value is packaged for delivery, at 240, the package binary string is forwarded over the network to a recipient of the message, such as a hub, bridge, router, switch, gateway, proxy, storage device, and the like.

The instructions may utilize a wide data path CRC calculator or generator, such as one that processes on 256 bit or 128 bit words. Binary messages of arbitrary word lengths are aligned to the word size of the CRC calculator (given size). Next, the resulting CRC value is rewound back to the arbitrary word length of the original binary message. So, a single large or wide path CRC calculator is used to support a variety of different arbitrary word lengths.

Figure 3:
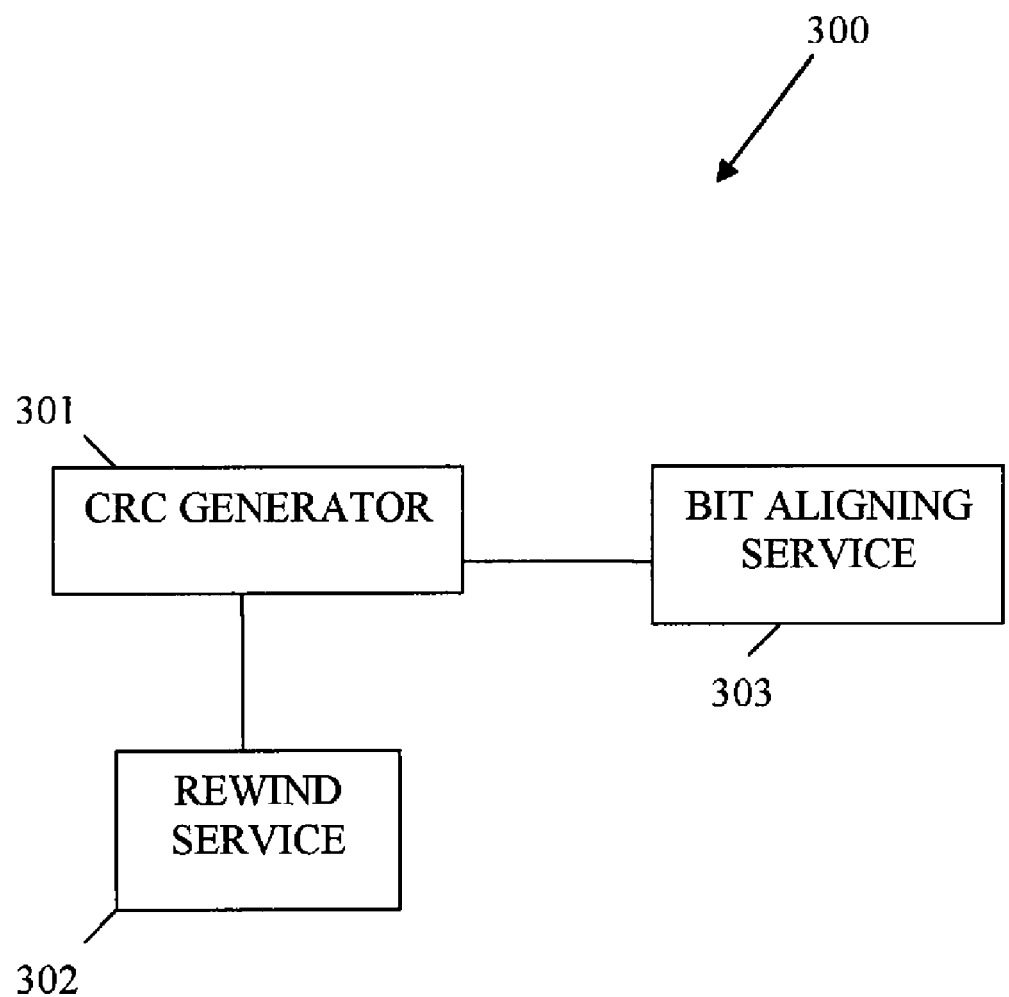
FIG. 3 is a diagram of a CRC generation and checking system, according to an example embodiment.

FIG. 3 is a diagram of a CRC generation and checking system 300, according to an example embodiment. The CRC generation and checking system 300 is implemented within a machine-accessible and readable media of a machine. In an embodiment, the CRC generation and checking system 300 implements, among other things, the methods 100 and 200 of the FIGS. 1 and 2, respectively.

The CRC generation and checking system 300 includes a CRC generator (calculator) 301 and a rewinding service 302. The CRC generating and checking system 300 may also include a bit aligning service 303. Each of these will now be discussed in turn.

The CRC generator 301 is implemented as a CRC value or checksum generator for a wide data path, such as but not limited to a 256 bit word or a 128 bit word. It is noted that other larger or slightly smaller word path sizes may also be used with the CRC generator 301. That is, the CRC generator 301 is not specifically tied to a specific word length, but the word length is should be selected as being considered large or supportive of a wide data path. The point is that CRC generator 301 handles word sizes that are larger than what is typically experienced over the network from senders and receivers of information (data). The CRC generator 301 interacts with the rewinding service 302 and if present, the bit aligning service 303.

The rewinding service 302 is implemented as a technique to back track or rewind a CRC value produced by the CRC generator 301 to be an adjusted CRC value that represents a checksum for a binary message in its original size. That is, the CRC generator 301 produces a CRC value for an inflated or larger word size associated with a given binary message and that inflated CRC value is corrected to be the proper value for the original and native size of the binary message via the rewinding service 302. Examples and even pseudo code (Perl script) for performing a rewinding service were presented above with respect to the FIGS. 1 and 2.

The CRC generation and checking system 300 may also include a bit aligning service 303. The bit aligning service 303 takes a binary message in its original size and aligns it or stuffs it into a word size that is supported by the CRC generator 301. This permits a variety of different data paths of varying word sizes to be mapped to the supported wide data path of the CRC generator 301 for produces an initial CRC value (checksum). One technique for processing the bit aligning service 303 is to pack binary zeros on the end of the binary string in its original size until the desired or wide word size of the CRC generator 301 is reached or achieved.

Figure 4:
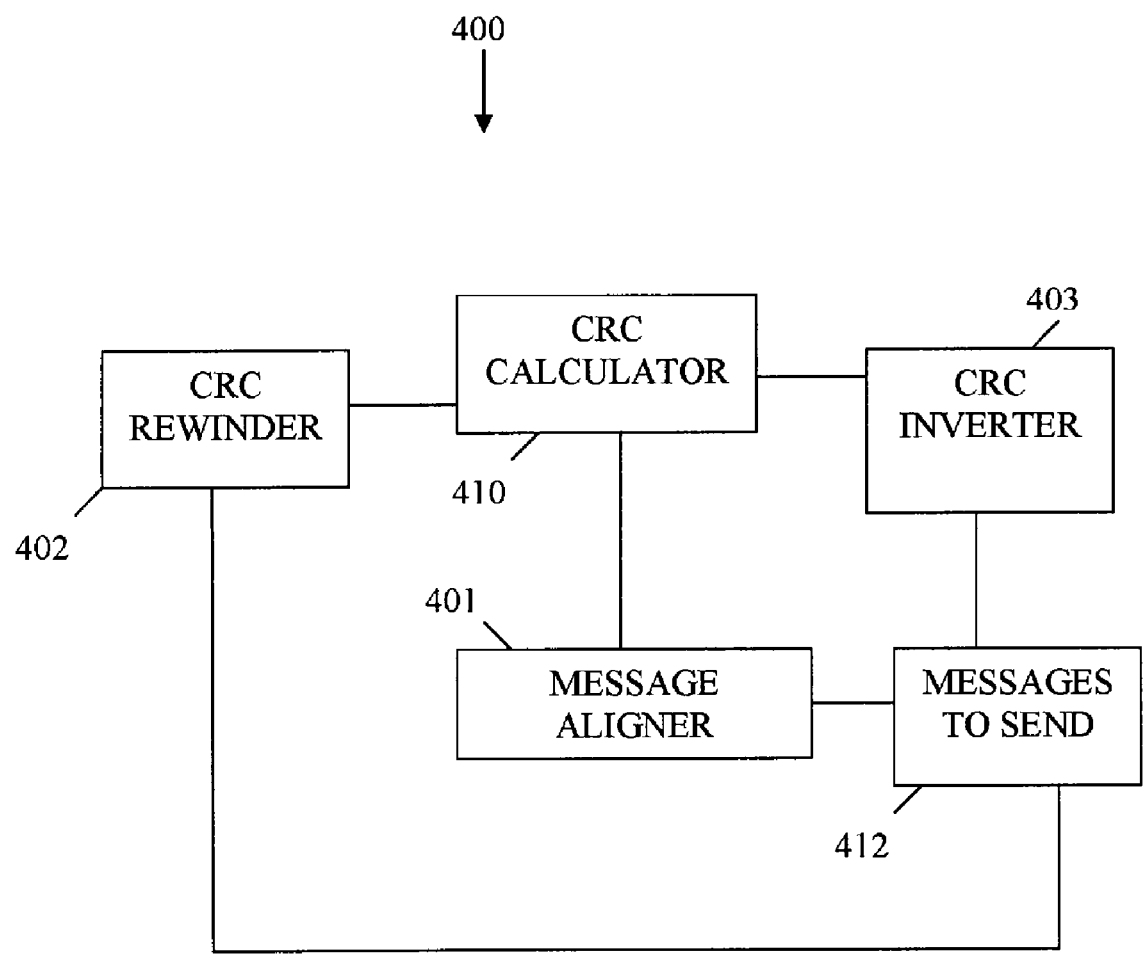
FIG. 4 is a diagram of another CRC generation and checking system, according to an example embodiment.

FIG. 4 is a diagram of another CRC generation and checking system 400, according to an example embodiment. The CRC generation and checking system 400 is implemented in a machine-accessible and readable medium and is accessible over a network. The network may be wired, wireless, or a combination of wired and wireless. The CRC generation and checking system 400 presents an alternative arrangement to that which was presented with the CRC generation and checking system 300 represented and discussed within the context of the FIG. 3.

The CRC generation and checking system 400 includes a message aligner 401 and a CRC rewinder 402. The CRC generation and checking system 400 may also include a CRC inverter 403. The CRC generation and checking system 400 also interacts with a CRC calculator 410 and messages 412 that are to be sent, forwarded, or transmitted over the network to a recipient. Each of these will now be discussed in turn.

The message aligner 401 may be implemented in software and/or firmware within a machine as a means for aligning the bit messages that are to be sent over the network. The means for aligning the bit messages maps or messages to send 412 from their given or original word lengths or sizes to a desired word size or length associated with the CRC calculator 410. The means for aligning the bit messages also passes the new messages to send to the CRC calculator 410 for producing a CRC value. Once the CRC value is produced for the messages to send in the aligned or desired size, the CRC value is passed to the CRC rewinder 402.

The CRC rewinder 402 may be implemented in software and/or firmware within a machine as a means for rewinding the CRC value such that the CRC value is associated with the messages to send 412 in their original, given, or actual sizes. The means for rewinding the CRC values iterates the CRC value produced by the CRC calculator 410 for N iterations, where N is equal to the difference between the desired word size or word size supported by the CRC calculator 410 and the actual word size of the messages to send 412. During each iteration, a trailing or LSB is dropped and an action is taking on the resulting or running value in response to what the value of the LSB was. So, if the LSB was a 1, then the running value is added to the divisor used to calculate the CRC value, and if the LSB is a 0, then the running value is added to a string of 0's of the length of the divisor. Examples of this technique and how to achieve it were discussed in detail above with respect to the FIGS. 1-3. The means for rewinding the CRC values produces rewound CRC values that may be transmitted as proper CRC values with the messages to send 412 over the network.

According to an embodiment, the CRC generation and checking system 400 may also include a CRC inverter 403. The CRC inverter 403 may be implemented as software within software and/or firmware as a means for inverting the rewound CRC values. The means for inverting the rewound CRC values inverts the rewound and altered CRC values for transmission over the network to recipients of the messages to send 412.

In various embodiments, the CRC generation and checking system 400 is implemented within a variety of machines or devices as software and/or firmware, such as but not limited to network routers, network hubs, network bridges, network switches, proxies, gateways, storage devices, and the like. It is to be understood however, that the CRC generation and checking system 400 need not be tied to any specific hardware implementation, machine, or device. That is, the CRC generation and checking system 400 may be implemented entirely as software instructions independent of any specific hardware device or environment.

Figure 5:
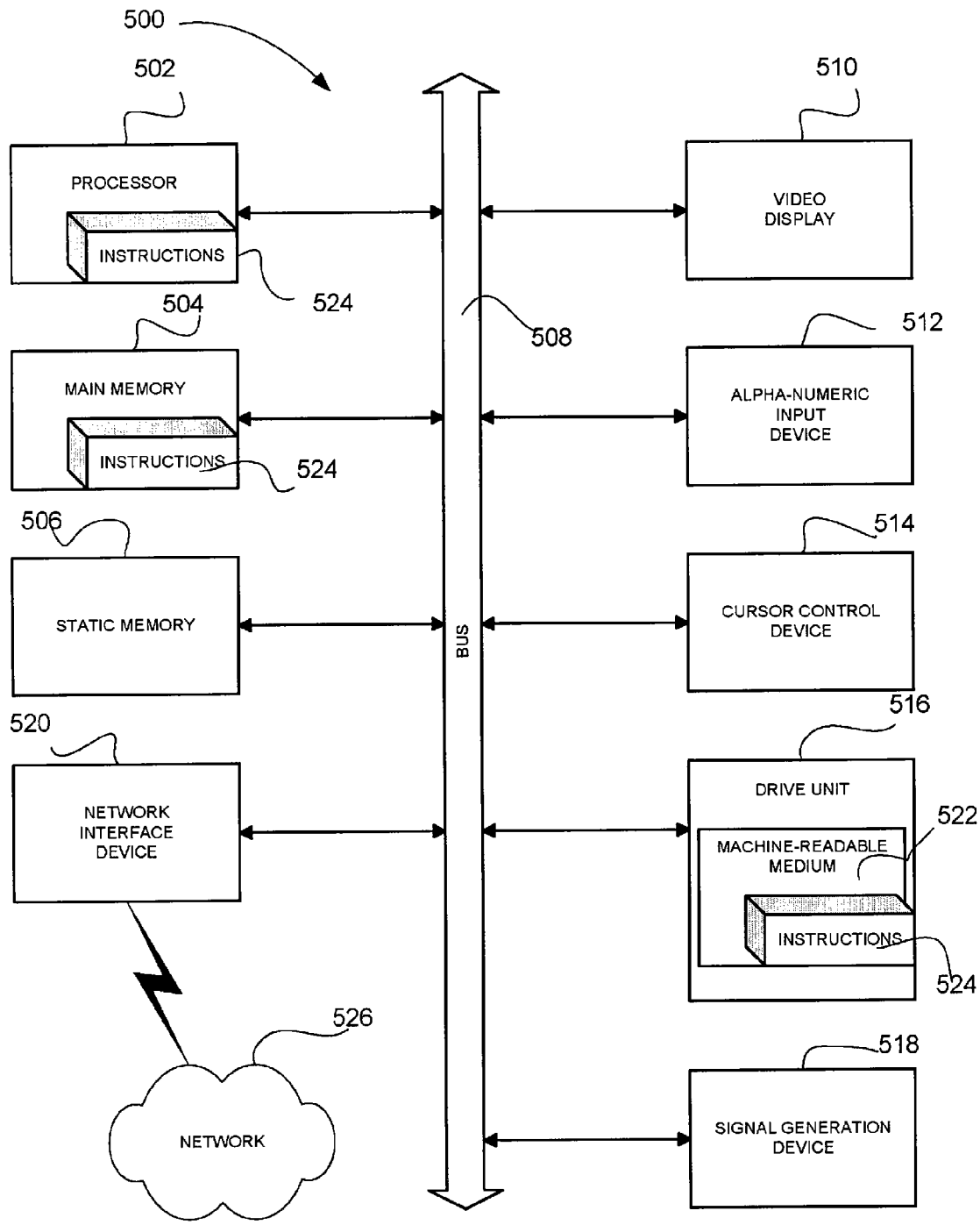
FIG. 5 is a schematic diagram of a machine having instructions for processing methods discussed herein, according to an example embodiment.

FIG. 5 is a schematic diagram of a machine having instructions 524 for processing methods 100 and 200 discussed herein, according to an example embodiment.

Thus, FIG. 5 shows a diagrammatic representation of machine in the example form of a computer system 500 within which a set of instructions, for causing the machine to perform any one or more of the methodologies discussed herein, may be executed. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 500 includes a processor 502 (e.g., a central processing unit (CPU), a graphics processing unit (GPU) or both), a main memory 504 and a static memory 506, which communicate with each other via a bus 508. The computer system 500 may further include a video display unit 510 (e.g., a liquid crystal display (LCD) or a cathode ray tube (CRT)). The computer system 500 also includes an alphanumeric input device 512 (e.g., a keyboard), a user interface (UI) navigation device 514 (e.g., a mouse), a disk drive unit 516, a signal generation device 518 (e.g., a speaker) and a network interface device 520.

The disk drive unit 516 includes a machine-readable medium 522 on which is stored one or more sets of instructions and data structures (e.g., software 524) embodying or utilized by any one or more of the methodologies or functions described herein. The software 524 may also reside, completely or at least partially, within the main memory 504 and/or within the processor 502 during execution thereof by the computer system 500, the main memory 504 and the processor 502 also constituting machine-readable media.

The software 524 may further be transmitted or received over a network 526 via the network interface device 520 utilizing any one of a number of well-known transfer protocols (e.g., HTTP).

While the machine-readable medium 522 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present invention, or that is capable of storing, encoding or carrying data structures utilized by or associated with such a set of instructions. The term "machine-readable medium" shall accordingly be taken to include, but not be limited to, solid-state memories, optical and magnetic media, and carrier wave signals.

The above description is illustrative, and not restrictive. Many other embodiments will be apparent to those of skill in the art upon reviewing the above description. The scope of embodiments should therefore be determined with reference to the appended claims, along with the full scope of equivalents to which such claims are entitled.

The Abstract is provided to comply with 37 C.F.R. §1.72(b) and will allow the reader to quickly ascertain the nature and gist of the technical disclosure. It is submitted with the understanding that it will not be used to interpret or limit the scope or meaning of the claims.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single disclosed embodiment. Thus the following claims are hereby incorporated into the Description of the Embodiments, with each claim standing on its own as a separate exemplary embodiment.

The invention claimed is:

1. A method implemented in a machine-readable medium and to execute on a processing-enabled device, comprising:
   identifying, by the processing-enabled device, a binary message of a first size;
   aligning, by the processing-enabled device, the binary message to a second size, when the first size is less than the second size;
   calculating, by the processing-enabled device, a cyclic redundancy check (CRC) value for the aligned binary message;
   rewinding, by the processing-enabled device, the CRC value to be adjusted from the second size down to the first size; and
   appending, by the processing-enabled device, the rewound CRC value to the binary message of the first size and forwarding to a recipient of the binary message.

2. The method of claim 1, wherein aligning further includes appending binary zeros to the binary message of the first size, wherein a total number of binary zeros is equal to the second size minus the first size.

3. The method of claim 1, wherein appending further includes inverting the rewound CRC value before appending to the binary message.

4. The method of claim 3, wherein appending further includes stuffing binary zeros on an end of the binary message and inverted and rewound CRC value to align on a byte or word boundary before forwarding to the recipient.

5. The method of claim 1, wherein rewinding further includes:
   iterating the CRC value on a bit level; and
   removing a bit during each iteration until the rewound CRC value is associated with the binary message of the first size.

6. The method of claim 5 further comprising, adding, by the processing-enabled device, a divisor associated with generating the rewound CRC value to the CRC value during each iteration if the removed bit during a particular iteration is set to one.

7. The method of claim 5 further comprising, adding, by the processing-enabled device, zeros to the CRC value during each iteration if the removed bit during a particular iteration is set to zero.

8. A machine-accessible medium having instructions embedded therein, the instructions, when executed by a machine, cause the machine to:
   calculate, by the machine, a CRC value associated with a binary message for a given length; and
   rewind, by the machine, the CRC value to a new CRC value that is adjust down from the given length to a desired length associated with the binary message, the desired length is less than the given length.

9. The medium of claim 8 further including instructions for:
   inverting, by the machine, the new CRC value; and
   concatenating, by the machine, the inverted new CRC value to the binary message of the desired length.

10. The medium of claim 9 further including instructions for forwarding, by the machine, the binary message with the inverted new CRC value to a recipient, wherein the recipient is at least one of a network hub, switch, router, gateway, bridge, and storage device.

11. The medium of claim 8, wherein rewinding further includes:
    iteratively removing an excess bit from the CRC value until the desired length is obtained; and
    adding a divisor used in calculating the new CRC value during each iteration if the removed excess bit is set to one.

12. The medium of claim 8 further including instructions for aligning, by the machine, the binary message to the given length before calculating the CRC value.

13. The medium of claim 12, wherein aligning further includes concatenating binary zeros onto the end of the binary message beginning at the desired length and proceeding with concatenation until the given length is obtained.

14. A system, comprising:
    a cyclic redundancy check (CRC) generator; and
    a rewinding service, wherein the CRC generator is to produce a CRC value for a bit message at a desired length, and wherein the rewinding service is to adjust the CRC value down to an original length of the bit message, the original length is less than the desired length.

15. The system of claim 14 further comprising, a bit aligning service to align the bit message from its original length to the desired length for processing by the CRC generator.

16. The system of claim 15, wherein the bit aligning service is to preprocess the bit message by stuffing binary zeros at the end of the bit message until the bit message is of the desired length.

17. The system of claim 14, wherein the CRC generator is at least one of a CRC calculator for 256 bit words and a CRC calculator for 128 bit words.

18. The system of claim 14, wherein the rewinding service is to iterate the CRC value for a number of iterations that is equal to the original length minus the desired length to produce the adjusted CRC value.

19. The system of claim 14, wherein the rewinding service is to drop a trailing bit of the CRC value during each iteration and perform an addition against a resulting value using a divisor used by the CRC generator if the trailing bit is set to one.

20. A system, comprising:

a means for aligning bit messages to a desired byte boundary and passing the aligned bit messages to a cyclic redundancy check (CRC) generator to produce CRC values for the aligned bit messages; and a means for rewinding the CRC values to be adjusted down to actual lengths of the bit messages instead of lengths associated with the desired byte boundary, the actual lengths are less than the lengths associated with the desired byte boundary.

21. The system of claim 20 further comprising, a means for inverting the rewound CRC values before transmitting them with the bit messages to recipients.

22. The system of claim 20, wherein the system is implemented in at least one of network router, a network switch, a network hub, a network bridge, a proxy, a gateway, and a storage device.

23. The system of claim 20, wherein the means for aligning further includes appending binary zeros to the bit messages until the desired byte boundary is achieved.

24. The system of claim 20, wherein the means for rewinding further includes iterating the CRC values eliminating a trailing bit during each iteration and augmenting resulting values during each iteration by adding a string of zeros if the trailing bit is a zero or by adding a divisor used to produce the CRC values if the trailing bit is a one.

\* \* \* \* \*

UNITED STATES PATENT AND TRADEMARK OFFICE
CERTIFICATE OF CORRECTION

PATENT NO. : 7,634,712 B2 Page 1 of 1
APPLICATION NO. : 11/382694
DATED : December 15, 2009
INVENTOR(S) : Rajesh E. Bawankule et al.

It is certified that error appears in the above-identified patent and that said Letters Patent is hereby corrected as shown below:

In column 3, line 5, delete "110101110111110" and insert -- 110101110110000 --, therefor.

In column 3, lines 36–38, delete " $\frac{10011}{10011}$ " and insert -- $\frac{10011}{10011}$ --, therefor.

In column 6, line 3, delete "00000" and insert -- $\frac{00000}{\_\_\_\_\_}$ --, therefor.

In column 6, line 57, delete " $fb = lfsrf[0];$ " and insert -- $fb = lfsr[0];$ --, therefor.

Signed and Sealed this

Thirtieth Day of March, 2010

David J. Kappos
*Director of the United States Patent and Trademark Office*

UNITED STATES PATENT AND TRADEMARK OFFICE
CERTIFICATE OF CORRECTION

PATENT NO.       : 7,634,712 B2  
APPLICATION NO.  : 11/382694  
DATED            : December 15, 2009  
INVENTOR(S)      : Bawankule et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 761 days.

Signed and Sealed this

Twenty-first Day of December, 2010

David J. Kappos  
*Director of the United States Patent and Trademark Office*